United States Patent [19]
Riggio, Jr.

[11] Patent Number: 5,463,339
[45] Date of Patent: Oct. 31, 1995

[54] AMORPHOUS, THIN FILM TRANSISTOR DRIVER/RECEIVER CIRCUIT WITH HYSTERESIS

[75] Inventor: Salvatore R. Riggio, Jr., Boca Raton, Fla.

[73] Assignee: International Business Machines Incorporated, Armonk, N.Y.

[21] Appl. No.: 261,351

[22] Filed: Jun. 16, 1994

Related U.S. Application Data

[63] Continuation of Ser. No. 175,028, Dec. 29, 1993, abandoned.

[51] Int. Cl.$^6$ .................................................. H03K 3/295
[52] U.S. Cl. ........................... 327/206; 327/563; 327/65
[58] Field of Search ........................ 307/494, 497, 307/290; 327/563, 206, 205, 65; 257/57

[56] References Cited

U.S. PATENT DOCUMENTS

| | | | |
|---|---|---|---|
| 4,338,527 | 7/1982 | Nagano | 307/494 |
| 4,367,419 | 1/1983 | Yazawa et al. | 327/563 |
| 4,460,978 | 7/1984 | Jiang et al. | 365/154 |
| 4,467,451 | 8/1984 | Moyer | 365/156 |
| 4,538,246 | 8/1985 | Wang et al. | 365/226 |
| 4,595,999 | 6/1986 | Betirac | 365/154 |
| 4,635,229 | 1/1987 | Okumura et al. | 365/154 |
| 4,812,676 | 3/1989 | Yang et al. | 327/206 |
| 4,916,338 | 4/1990 | Metz | 307/497 |
| 4,977,336 | 12/1990 | Martiny | 327/205 |
| 5,068,552 | 11/1991 | Itou et al. | 327/563 |
| 5,113,146 | 5/1992 | de Jager et al. | 307/494 |
| 5,262,682 | 11/1993 | Mitsuya et al. | 307/290 |

FOREIGN PATENT DOCUMENTS

0345058A2  6/1989  European Pat. Off. .

OTHER PUBLICATIONS

R. A. Street, "Amorphous silicon electronics", pp. 70–75, MRS Bulletin, Nov. 1992.

M. Shur and M. Tack, "Physics of amorphous silicon based allow field-effect transistors", J. App. Phys, 55(10), 15 May 1984, pp. 3831–3842.

Michael Shur, "Physics of semiconductor devices", Prentice Hall, 1990, pp. 437–446.

Arun Madan and Melvin P. Shaw, "The physics and applicatins of amorphous semiconductors", Academic Press 1988, chapters 2 and 3 (pp. 35–317).

*Primary Examiner*—Timothy P. Callahan
*Assistant Examiner*—Terry L. Englund
*Attorney, Agent, or Firm*—Paul T. Kashimba; Martin J. McKinley

[57] ABSTRACT

A driver circuit has hysteresis. The driver circuit includes a comparator circuit having first and second inputs and an output. The driver circuit also includes a variable voltage divider circuit coupled between the second input and the output of said comparator. The voltage divider circuit provides a first voltage to the second input of the comparator when the output of the comparator is at a second voltage, and a third voltage to the second input of the comparator when the output of the comparator is at a fourth voltage. Therefore, the output voltage of the comparator switches from the second to the fourth voltage when the voltage of a signal at the first input of the comparator rises above the first voltage, and the output voltage of the comparator switches from the fourth to the second voltage when the voltage of the signal at the first input of the comparator falls below the third voltage.

1 Claim, 1 Drawing Sheet

AMORPHOUS, THIN FILM TRANSISTOR DRIVER/RECEIVER CIRCUIT WITH HYSTERESIS

RELATED APPLICATIONS (1) The present application is a continuation of application Ser. No. 08/175,028, filed Dec. 29, 1993 now abandoned, by Salvatore R. Riggio, Jr., for "AMORPHOUS, THIN FILM TRANSISTOR DRIVER/RECEIVER CIRCUIT WITH HYSTERESIS". (docket BC9-93-107)

(2) Application Ser. No. 08/260,941, filed concurrently herewith, by Salvatore R. Riggio, Jr. for "A NON-VOLATILE MEMORY UTILIZING A THIN FILM, FLOATING GATE, AMORPHOUS TRANSISTOR" (docket BC9-93-105X), said application being incorporated herein by reference.

BACKGROUND OF THE INVENTION

This invention pertains to driver/receiver circuits and, more particularly, to a driver/receiver circuit that utilizes thin film, amorphous transistors.

Related application (2) describes a non-volatile memory utilizing thin film, amorphous transistors. Since the preferred embodiment of the invention of such co-pending application utilizes only amorphous, thin film, type "N" transistors, a driver/receiver circuit is needed that can also be constructed of only amorphous, thin film, type "N" transistors. Accordingly, such a driver/receiver circuit is described below.

SUMMARY OF THE INVENTION

Briefly, the invention is a driver circuit having hysteresis. The driver circuit includes a comparator circuit having first and second inputs and an output. The driver circuit also includes a variable voltage divider circuit coupled between the second input and the output of said comparator. The voltage divider circuit provides a first voltage to the second input of the comparator when the output of the comparator is at a second voltage, and a third voltage to the second input of the comparator when the output of the comparator is at a fourth voltage. Therefore, the output voltage of the comparator switches from the second to the fourth voltage when the voltage of a signal at the first input of the comparator rises above the first voltage, and the output voltage of the comparator switches from the fourth to the second voltage when the voltage of the signal at the first input of the comparator falls below the third voltage.

DESCRIPTION of an ILLUSTRATIVE EMBODIMENT

Figure 1:
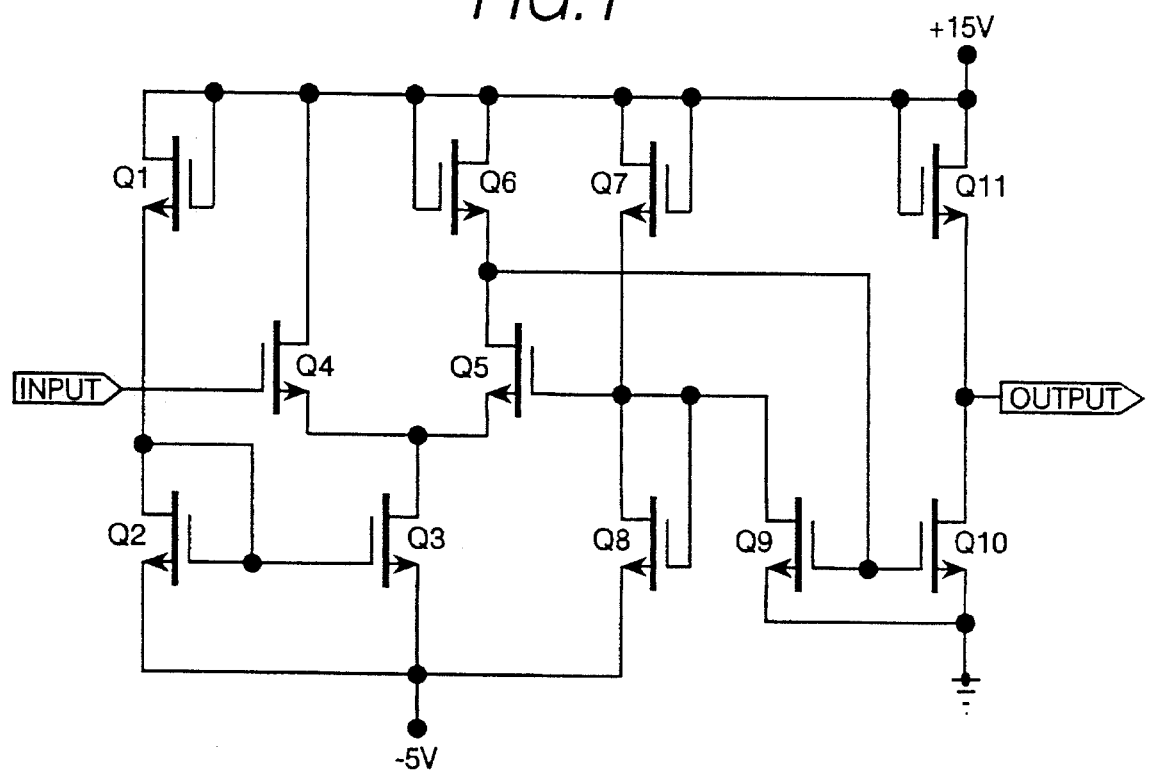
FIG. 1 is a schematic diagram of the driver/receiver circuit of the present invention.

FIG. 1 is a schematic diagram of an illustrative embodiment of the driver/receiver circuit of the present invention. This driver circuit is preferably constructed using only type "N" (or only type "P") amorphous silicon, thin film transistors, as described in the referenced co-pending application, although a more conventional construction is also possible.

Referring to FIG. 1, transistors Q1 through Q6 form a voltage comparator circuit, with transistors Q4 and Q5 forming a differential pair, Q6 an active load for transistor Q5, and transistors Q1 through Q3 a current mirror which is connected to the sources of transistors Q4 and Q5. The "non-inverting" input of the comparator is at the gate of transistor Q4, which is also coupled to the INPUT port of the driver/receiver circuit. The "inverting" input of the comparator is located at the gate of transistor Q5. Transistors Q7, Q8 and Q9 form a variable voltage divider circuit; the input of the divider circuit is at the gate of transistor Q9, while the output is at the drain of Q8, which is coupled back to the inverting input of the comparator at the gate of Q5. Transistors Q10 and Q11 form an inverter, the input of which is coupled to the output of the comparator at the drain of transistor Q5.

Figure 2:
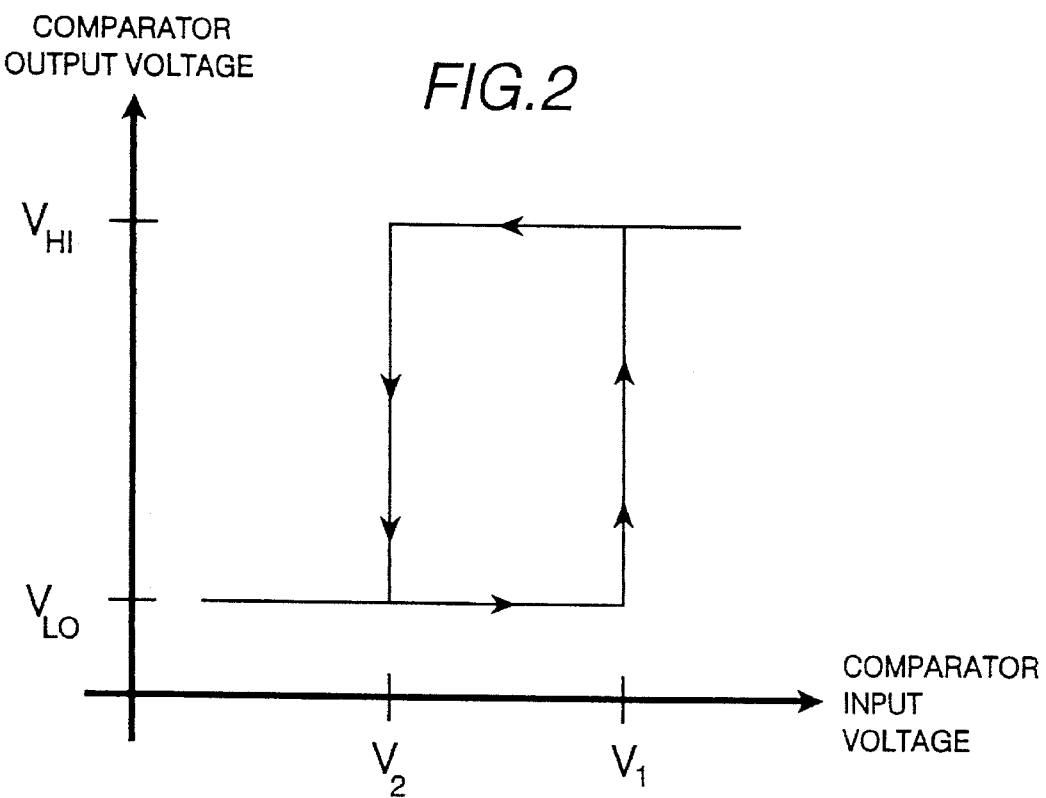
FIG. 2 is a graph of the output voltage of the comparator circuit of the driver/receiver as a function of the input voltage at the non-inverting input of the comparator.

The operation of the driver/receiver circuit can best be understood by reference to both FIGS. 1 and 2. Initially, if the input voltage at the non-inverting input (the gate of Q4) of the comparator (which is also the voltage at the INPUT port) is below V2 as indicated in FIG. 2, the output voltage (at the drain of Q5) is at VLO. Since the comparator's output voltage is at VLO, transistor Q9 of the variable voltage divider circuit is turned OFF. Consequently, the voltage at the inverting input (the gate of Q5) of the comparator is substantially at V1; V1 being determined by the voltage divider circuit formed by transistors Q7 and Q8. With the inverting input of the comparator at V1, the output voltage of the comparator will remain at VLO unless and until the voltage at the INPUT port rises above V1.

When the voltage at the INPUT port rises above V1, the output voltage of the comparator switches to VHI, thereby causing transistor Q9 of the voltage divider circuit to switch ON. Consequently, the voltage at the inverting input of the comparator is substantially at V2; V2 being determined by the voltage divider circuit formed by transistors Q9 and Q7. With the inverting input of the comparator at V2, the output voltage of the comparator will remain at VHI unless and until the voltage at the INPUT port drops below V2. It should be apparent that the two threshold voltages (V1 and V2) of the hysteresis curve of FIG. 2 are determined by the resistances of the channels of transistors Q7, Q8 and Q9 and, in turn, the resistances of these channels is determined by the width-to-length ratios of the channels in conjunction with the channel resistivity.

Since transistors Q10 and Q11 form an inverter, the voltage at the OUTPUT port of the driver/receiver circuit will be inverted from the output voltage as illustrated in FIG. 2.

I claim as my invention:

1. A driver circuit, comprising:

a comparator circuit including: first and second transistors interconnected to form a differential pair; a current regulating circuit having a third transistor coupled to a first element of each of said first and second transistors; and a load circuit having a fourth transistor coupled to a second element of said second transistor;

a variable voltage divider circuit having a fifth transistor coupled between said second element and a third element of said second transistor; and an inverter circuit having sixth and seventh transistors, said second element of said second transistor being coupled to said inverter circuit;

wherein said first, second, third, fourth, fifth, sixth, and seventh transistors are amorphous, thin film transistors of the same type, N or P.

* * * * *